US009398684B2

(12) United States Patent
Hasegawa

(10) Patent No.: US 9,398,684 B2
(45) Date of Patent: Jul. 19, 2016

(54) SUBSTRATE UNIT, LIQUID CRYSTAL DISPLAY UNIT, AND ELECTRONIC APPARATUS

(71) Applicant: Japan Display Inc., Tokyo (JP)

(72) Inventor: Kazuya Hasegawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/718,873

(22) Filed: May 21, 2015

(65) Prior Publication Data

US 2015/0342033 A1    Nov. 26, 2015

(30) Foreign Application Priority Data

May 23, 2014    (JP) ................................. 2014-107528

(51) Int. Cl.
*G02F 1/13*    (2006.01)
*H05K 1/02*    (2006.01)
*H05K 1/03*    (2006.01)

(52) U.S. Cl.
CPC ............ *H05K 1/0268* (2013.01); *G02F 1/1309* (2013.01); *H05K 1/028* (2013.01); *H05K 1/0393* (2013.01); *H05K 2201/09781* (2013.01); *H05K 2201/10136* (2013.01)

(58) Field of Classification Search
CPC .... G02F 1/1309; H05K 1/0268; H05K 1/028; H05K 1/0393
See application file for complete search history.

(56) References Cited

U.S. PATENT DOCUMENTS

2003/0174480 A1*    9/2003    Matsuhira ........... G02F 1/13452
                                                                361/764
2006/0284821 A1*    12/2006    Takenaka ............... G09G 3/006
                                                                345/100

FOREIGN PATENT DOCUMENTS

JP        2004-095872        3/2004
JP        2009-224505        10/2009

* cited by examiner

*Primary Examiner* — James Dudek
(74) *Attorney, Agent, or Firm* — K&L Gates LLP

(57) ABSTRACT

A substrate unit includes a first substrate, a second substrate, an adhesive layer in which conductive particles and an adhesive agent are mixed, and an inspection pattern. In the inspection pattern, one of a first inspection electrode and a second inspection electrode includes a plurality of bar electrodes arranged to extend in a first direction and a connection electrode that connects the bar electrode to the other adjacent bar electrode. The first inspection electrode is conducted with the second inspection electrode at a first portion that includes at least one of the bar electrodes, the first inspection electrode is conducted with the second inspection electrode at a second portion that is different from the first portion and includes at least one of the bar electrodes, and the first portion and the second portion are arranged at positions not overlapped with each other along the first direction.

10 Claims, 13 Drawing Sheets

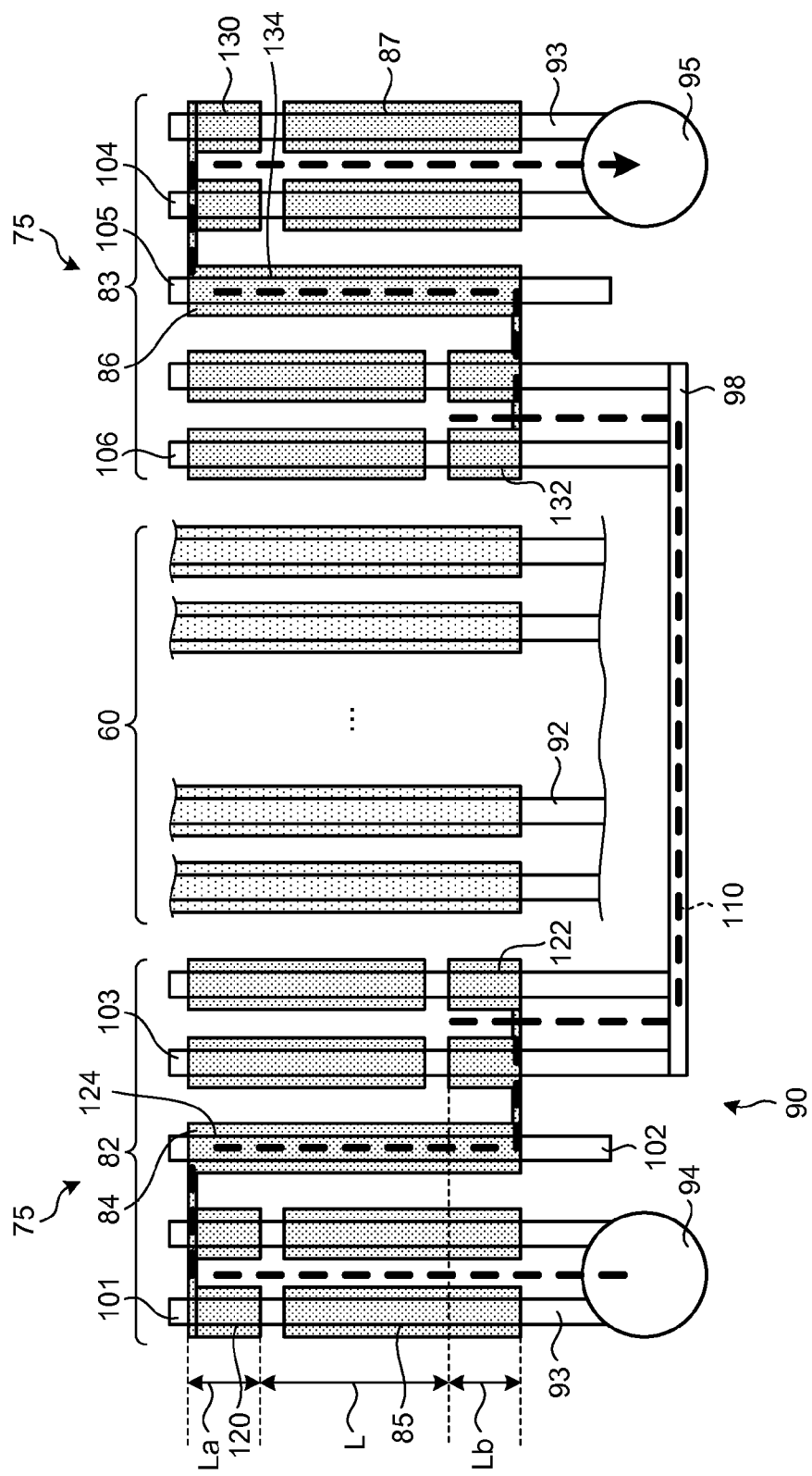

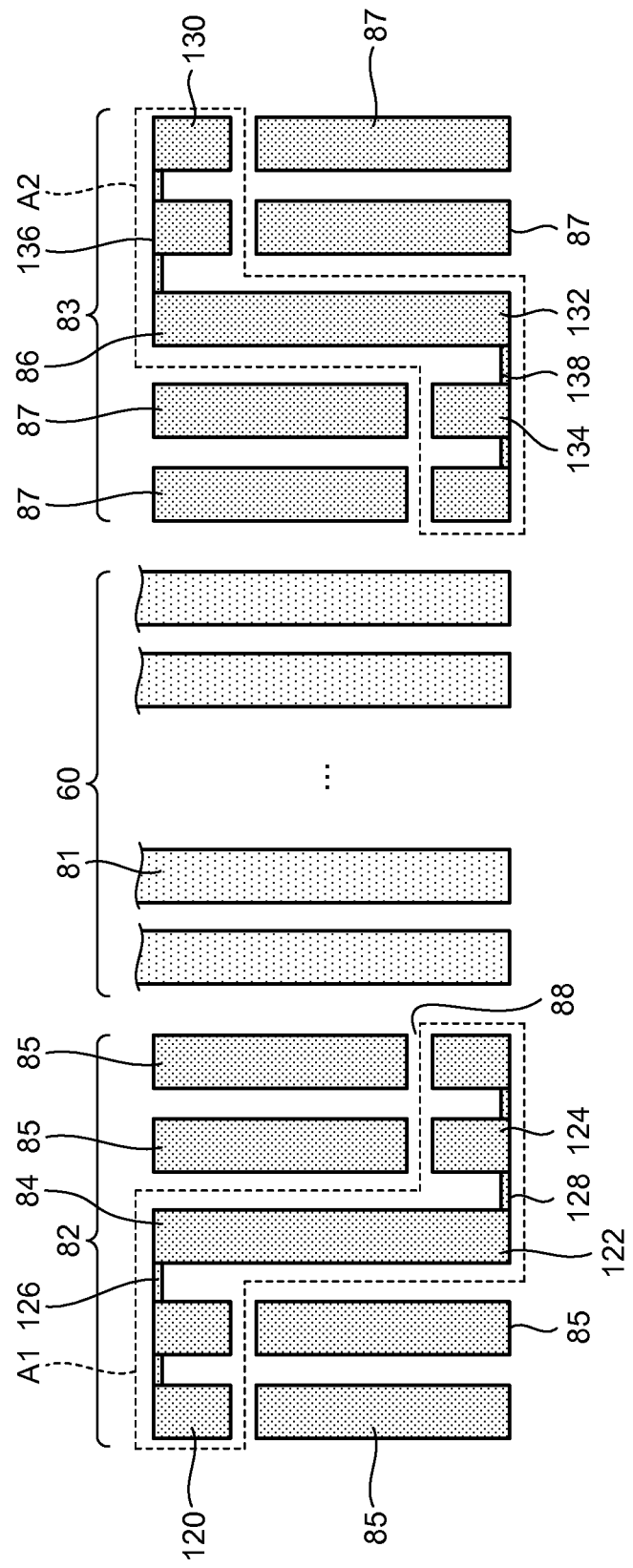

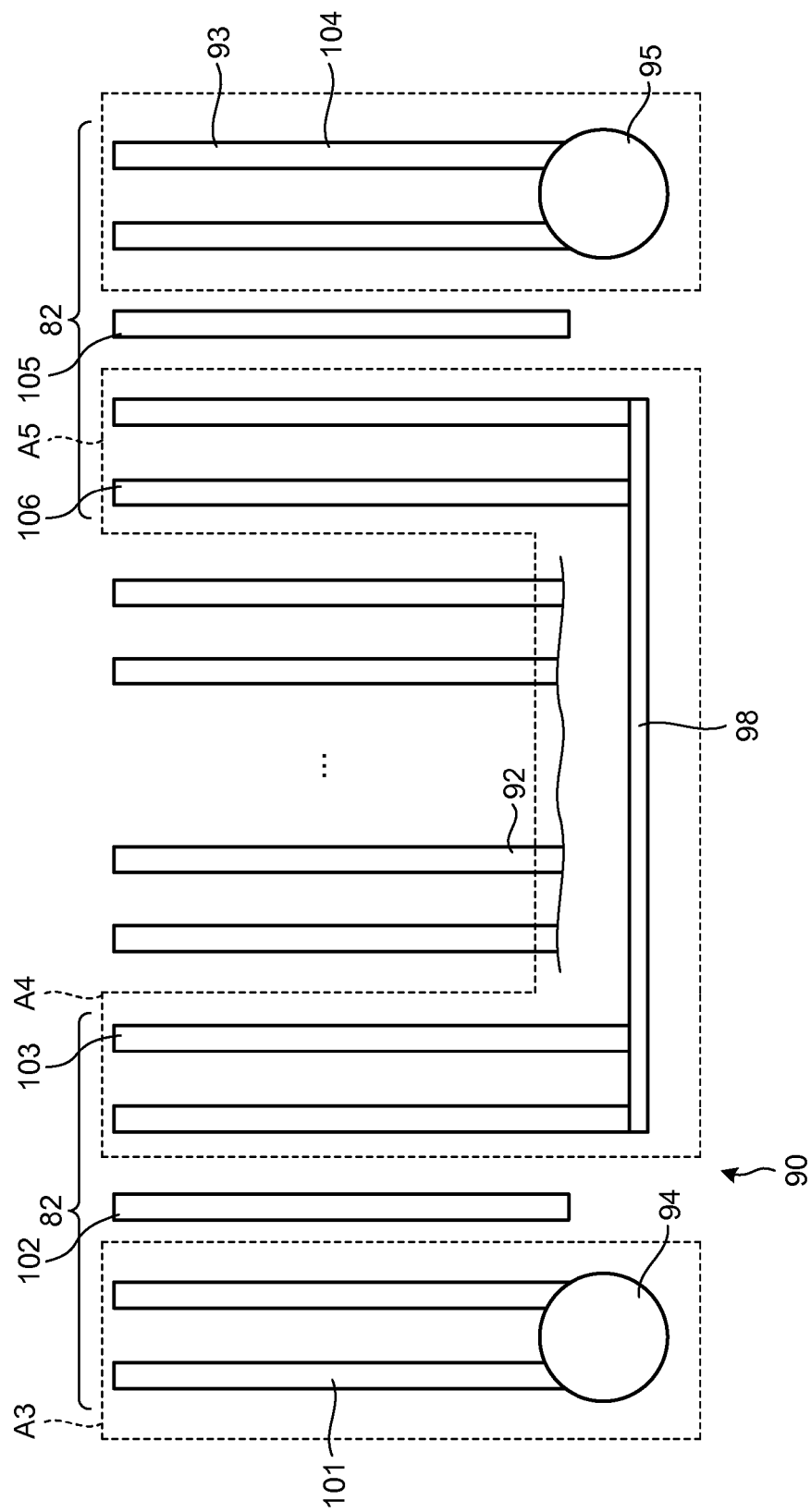

SUBSTRATE UNIT, LIQUID CRYSTAL DISPLAY UNIT, AND ELECTRONIC APPARATUS

CROSS REFERENCES TO RELATED APPLICATIONS

The present application claims priority to Japanese Priority Patent Application JP 2014-107528 filed in the Japan Patent Office on May 23, 2014, the entire content of which is hereby incorporated by reference.

BACKGROUND

1. Technical Field

The present invention relates to a substrate unit, a liquid crystal display unit including the substrate unit, and an electronic apparatus.

2. Description of the Related Art

Display apparatuses and electronic apparatuses such as a portable electronic apparatus include a substrate unit including a substrate provided with an electronic circuit or wiring (wiring substrate, and a circuit board), and a flexible substrate coupled to the substrate. In a case of the display apparatus, a substrate provided with a drive circuit of a liquid crystal panel is coupled to a control circuit that outputs an image signal via a flexible substrate. Also provided is a touch detection device that can detect an external proximity object, what is called a touch panel. A substrate provided with a detection electrode of the touch panel may be coupled to the flexible substrate.

As a method of coupling the substrate to the flexible substrate, as disclosed in Japanese Patent Application Laid-open Publication No. 2009-224505, an anisotropic conductive film (ACF) is arranged between the substrate and the flexible substrate and is crimped and coupled using a crimping head.

Japanese Patent Application Laid-open Publication No. 2004-95872 (JP-A-2004-95872) discloses a structure in which both of the substrate and the flexible substrate configure one circuit to be conducted when the substrate and the flexible substrate are joined, and allows a coupling state between the substrate and the flexible substrate to be detected to easily and quantitatively detect the coupling state when the substrate is coupled to the flexible substrate.

As disclosed in JP-A-2004-95872, by providing a circuit for detecting the coupling state on the substrate and the flexible substrate, the coupling state of the substrate can be detected in detecting a conductive state. However, with the structure disclosed in JP-A-2004-95872, conduction may be caused even when a crimp by the crimping head is insufficient.

For the foregoing reasons, there is a need for a substrate unit, a liquid crystal display unit and an electronic apparatus that can detect a coupling state between a substrate and a flexible substrate in more detail.

SUMMARY

According to an aspect, a substrate unit includes: a first substrate provided with first wiring; a second substrate provided with second wiring on a flexible substrate body; an adhesive layer in which conductive particles and an adhesive agent are mixed to conduct the first wiring of the first substrate with the second wiring of the second substrate; and an inspection pattern including a first inspection electrode formed in a region of the first substrate in which the adhesive layer is arranged and a second inspection electrode formed in a region of the second substrate facing the first inspection electrode and conducted with the first inspection electrode via the adhesive layer. In the inspection pattern, one of the first inspection electrode and the second inspection electrode includes a connection electrode that connects a plurality of adjacent bar electrodes arranged to extend in a first direction to each other. The first inspection electrode is conducted with the second inspection electrode at a first portion that includes at least one of the bar electrodes, the first inspection electrode is conducted with the second inspection electrode at a second portion that is different from the first portion and includes at least one of the bar electrodes, and the first portion and the second portion are arranged at positions not overlapped with each other along the first direction. Electric current does not flow when one of the first portion and the second portion is not conducted.

According to another aspect, a liquid crystal display apparatus includes a substrate unit comprising and a liquid crystal display unit stacked on the substrate unit. The substrate unit includes: a first substrate provided with first wiring; a second substrate provided with second wiring on a flexible substrate body; an adhesive layer in which conductive particles and an adhesive agent are mixed to conduct the first wiring of the first substrate with the second wiring of the second substrate; and an inspection pattern including a first inspection electrode formed in a region of the first substrate in which the adhesive layer is arranged and a second inspection electrode formed in a region of the second substrate facing the first inspection electrode and conducted with the first inspection electrode via the adhesive layer. In the inspection pattern, one of the first inspection electrode and the second inspection electrode including a connection electrode that connects a plurality of adjacent bar electrodes arranged to extend in a first direction to each other. The first inspection electrode being conducted with the second inspection electrode at a first portion that includes at least one of the bar electrodes, the first inspection electrode being conducted with the second inspection electrode at a second portion that is different from the first portion and includes at least one of the bar electrodes, and the first portion and the second portion being arranged at positions not overlapped with each other along the first direction. Electric current does not flow when one of the first portion and the second portion is not conducted.

According to further another aspect, an electronic apparatus includes a substrate unit and a control device coupled to a second substrate of the substrate unit. The substrate unit includes: a first substrate provided with first wiring; a second substrate provided with second wiring on a flexible substrate body; an adhesive layer in which conductive particles and an adhesive agent are mixed to conduct the first wiring of the first substrate with the second wiring of the second substrate; and an inspection pattern including a first inspection electrode formed in a region of the first substrate in which the adhesive layer is arranged and a second inspection electrode formed in a region of the second substrate facing the first inspection electrode and conducted with the first inspection electrode via the adhesive layer. In the inspection pattern, one of the first inspection electrode and the second inspection electrode including a connection electrode that connects a plurality of adjacent bar electrodes arranged to extend in a first direction to each other. The first inspection electrode being conducted with the second inspection electrode at a first portion that includes at least one of the bar electrodes, the first inspection electrode being conducted with the second inspection electrode at a second portion that is different from the first portion and includes at least one of the bar electrodes, and the first portion and the second portion being arranged at positions not overlapped with each other along the first direction. Electric current does not flow when one of the first portion and the second portion is not conducted.

Additional features and advantages are described herein, and will be apparent from the following Detailed Description and the figures.

BRIEF DESCRIPTION OF THE FIGURES

FIG. 6 is a front view illustrating an example of an inspection pattern;

FIG. 7 is a front view illustrating a structure of the inspection pattern on the cover glass side;

FIG. 8 is a front view illustrating a structure of the inspection pattern on the flexible substrate side;

DETAILED DESCRIPTION

The following describes an embodiment of the present invention in detail with reference to the drawings. The present invention is not limited to the content of the following embodiment. Components described below encompass a component easily conceivable by those skilled in the art and a substantially the same component. The components described below can be appropriately combined. In the following embodiment, an electronic apparatus including a substrate unit is assumed to be a display apparatus with a touch detection function. However, the embodiment is not limited thereto. The electronic apparatus may be various electronic apparatuses other than the display apparatus with a touch detection function.

Figure 1:
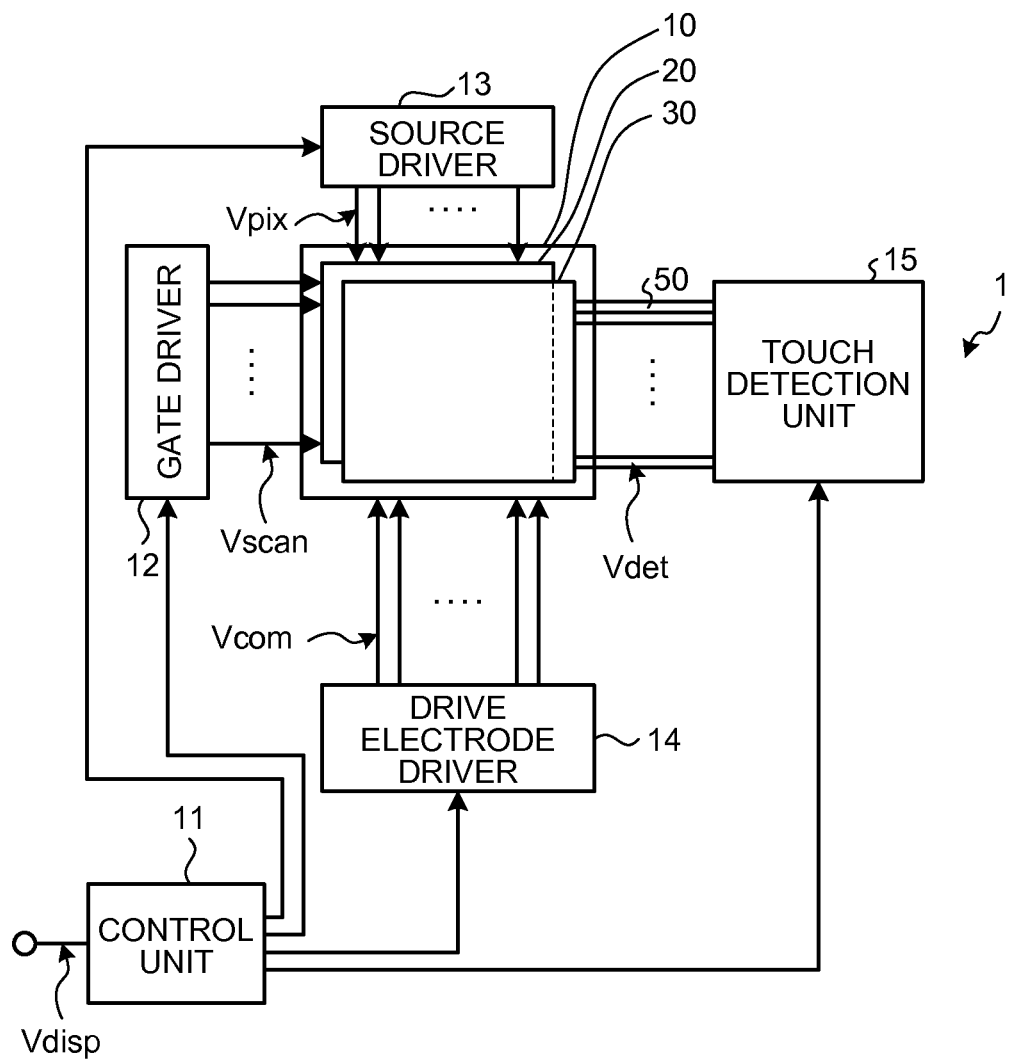
FIG. 1 is a block diagram illustrating a configuration example of a display apparatus with a touch detection function as an example of an electronic apparatus including a substrate unit.
Figure 2:
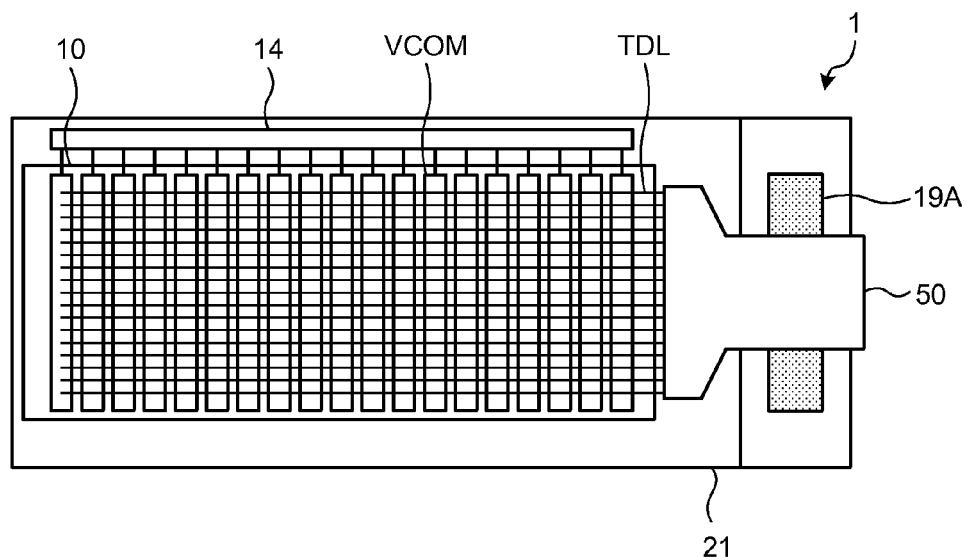
FIG. 2 is a diagram illustrating an example of a module on which the display apparatus with a touch detection function is mounted.
Figure 3:
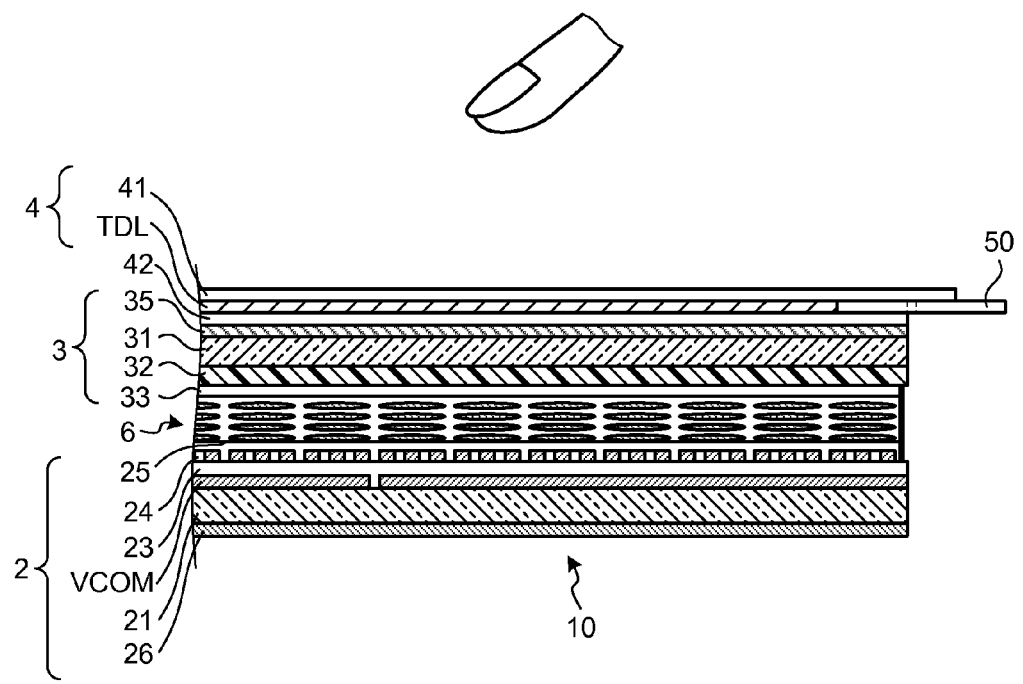
FIG. 3 is a sectional view illustrating a schematic sectional structure of the display device with a touch detection function.

FIG. 1 is a block diagram illustrating a configuration example of a display apparatus with a touch detection function as an example of an electronic apparatus including a substrate unit. FIG. 2 is a diagram illustrating an example of a module on which the display apparatus with a touch detection function is mounted. FIG. 3 is a sectional view illustrating a schematic sectional structure of the display device with a touch detection function. The display apparatus with a touch detection function according to the embodiment can be applied to various electronic apparatuses such as a smartphone, a television, and a digital camera.

As illustrated in FIG. 1, a display apparatus with a touch detection function 1 includes a display device with a touch detection function 10, a control unit 11, a gate driver 12, a source driver 13, a drive electrode driver 14, and a touch detection unit 15. In the display apparatus with a touch detection function 1, the touch detection unit 15 is coupled to the display device with a touch detection function 10 via a flexible substrate 50. In the display apparatus with a touch detection function 1, the display device with a touch detection function 10 incorporates a touch detection function. The display device with a touch detection function 10 according to the embodiment is a liquid crystal display unit with a touch detection function using liquid crystals for the display device. The display device with a touch detection function 10 is what is called an in-cell type device in which a liquid crystal display device 20 including a liquid crystal display element as a display element is integrated with an electrostatic capacitance type touch detection device 30. Alternatively, the display device with a touch detection function 10 may be what is called an on-cell type device in which the electrostatic capacitance type touch detection device 30 is mounted on the liquid crystal display device 20 including the liquid crystal display element as the display element.

As described later, the liquid crystal display device 20 is a device that sequentially scans each horizontal line to be displayed according to a scanning signal Vscan supplied from the gate driver 12. The control unit 11 is a circuit that supplies a control signal to each of the gate driver 12, the source driver 13, the drive electrode driver 14, and the touch detection unit 15 based on a video signal Vdisp supplied from the outside, and controls these components to be operated in synchronization with each other.

The touch detection device 30 is superposed on a display area of the liquid crystal display device 20 in a plan view (viewed in a direction perpendicular to a principal plane of the display device with a touch detection function 10). The touch detection device 30 operates based on a basic principle of electrostatic capacitance type touch detection, and outputs a touch detection signal Vdet. In the present invention, touch detection is performed using a mutual capacitance system. The touch detection device 30 is configured such that a touch detection signal Vdet is output for each detection block from a plurality of touch detection electrodes TDL described later via a voltage detector DET to be supplied to the touch detection unit 15. The touch detection electrode TDL is, for example, made of indium tin oxide (ITO). The touch detection device 30 uses a drive electrode serving as a common electrode of the liquid crystal display device 20 as a drive electrode.

The gate driver 12 has a function of sequentially selecting each horizontal line to be a display driving target of the display device with a touch detection function 10 based on the control signal supplied from the control unit 11. The source driver 13 is a circuit that supplies an image signal Vpix to each pixel of the display device with a touch detection function 10 based on the control signal supplied from the control unit 11. The drive electrode driver 14 is a circuit that supplies a drive signal Vcom to a drive electrode VCOM (described later) of the display device with a touch detection function 10 based on the control signal supplied from the control unit 11.

The touch detection unit 15 is a circuit that detects presence or absence of a touch (the contact state described above) on the touch detection device 30 based on the control signal supplied from the control unit 11 and the touch detection signal Vdet supplied from the touch detection device 30 of the display device with a touch detection function 10, and obtains coordinates of a touched position in a touch detection region if a touch is present.

Next, with reference to FIG. 2, the following describes an arrangement example of components of the touch detection device 30 in the display apparatus with a touch detection function 1. The display apparatus with a touch detection function 1 includes, as illustrated in FIG. 2, the display device with a touch detection function 10, the drive electrode driver 14, a chip on glass (COG) 19A, and the flexible substrate 50.

In the display device with a touch detection function 10, schematically illustrated are the drive electrode VCOM and the touch detection electrode TDL formed to three-dimensionally intersect with the drive electrode VCOM in a direction perpendicular to the surface of a TFT substrate 21. In this example, the drive electrode VCOM is formed in a short side direction of the display device with a touch detection function 10, and the touch detection electrode TDL is formed in a long side direction of the display device with a touch detection function 10. An output of the touch detection electrode TDL is arranged on a short side of the display device with a touch detection function 10, and coupled to the touch detection unit 15 mounted on the outside of the module via a terminal constituted by the flexible printed circuit (FPC) 50. A coupling portion between the display device with a touch detection function 10 and the flexible substrate 50 will be described later.

The drive electrode driver 14 is formed on a TFT substrate 21 that is a glass substrate. The COG 19A is a chip mounted on the TFT substrate 21 and incorporates respective circuits required for a display operation such as the control unit 11, the gate driver 12, and the source driver 13 illustrated in FIG. 1. The display apparatus with a touch detection function 1 may incorporate the drive electrode driver 14 in the COG 19A.

The display apparatus with a touch detection function 1 sequentially applies the drive signal Vcom to the drive electrode VCOM in a touch detection operation to perform line-sequential scanning for each detection line. That is, the display apparatus with a touch detection function 1 performs touch detection scanning in parallel with the long side direction of the display device with a touch detection function 10. In this way, the display apparatus with a touch detection function 1 outputs the touch detection signal Vdet from the short side of the display device with a touch detection function 10. Accordingly, the number of touch detection electrodes TDL can be reduced in the display apparatus with a touch detection function 1, and routing of wiring is facilitated in coupling to the touch detection unit 15 via the flexible substrate 50.

Next, the following describes a configuration example of the display device with a touch detection function 10 in detail. The display device with a touch detection function 10 includes a pixel substrate 2, a counter substrate 3 arranged to be opposed in a direction perpendicular to the surface of the pixel substrate 2, a cover glass 4 arranged to be opposed to a surface of the counter substrate 3 opposite to the pixel substrate 2, and a liquid crystal layer 6 interposed between the pixel substrate 2 and the counter substrate 3. A backlight (lighting apparatus) is arranged on a surface of the pixel substrate 2 opposite to the liquid crystal layer 6.

The liquid crystal layer 6 modulates light passing therethrough corresponding to a state of an electric field. As the liquid crystal layer 6, used is a liquid crystal display device including a liquid crystal of a horizontal electric field mode such as a fringe field switching (FFS) mode or an in-plane switching (IPS) mode. Orientation films may be provided in the display device with a touch detection function 10, between the liquid crystal layer 6 and the pixel substrate 2, and between the liquid crystal layer 6 and the counter substrate 3, respectively. The following display device with a touch detection function 10 will be described exemplifying a liquid crystal of the FFS mode.

The counter substrate 3 includes a glass substrate 31 and a color filter 32 formed on one surface of the glass substrate 31. The color filter 32 includes, for example, color regions colored in three colors of red (R), green (G), and blue (B). The color regions colored in three colors of red (R), green (G), and blue (B) are periodically arranged, for example, at an opening of the color filter 32, and the color regions of three colors R, G, and B are arranged corresponding to sub-pixels to be one pixel. The color filter 32 is opposed to the liquid crystal layer 6 in a direction perpendicular to the TFT substrate 21. The color filter 32 may include a combination of other colors so long as it is colored in different colors. Generally, in the color filter 32, the luminance of the color region of green (G) is higher than that of the color region of red (R) and the color region of blue (B). In the color filter 32, a black matrix may be formed to cover an outer circumference of the sub-pixel. The black matrix is made of material having a high light absorption rate.

The pixel substrate 2 includes the TFT substrate 21 serving as a circuit board, a plurality of pixel electrodes 24 arranged in a matrix on the TFT substrate 21, the drive electrode VCOM formed between the TFT substrate 21 and the pixel electrode 24, and an insulating layer 23 that insulates the pixel electrode 24 from the drive electrode VCOM. Each of the pixel electrodes 24 and the drive electrode VCOM is a translucent electrode made of translucent conductive material (translucent conductive oxide) such as indium tin oxide (ITO).

Although not illustrated, a semiconductor layer provided with a thin film transistor of each sub-pixel, and wiring such as a signal line that supplies a pixel signal and a scanning line that drives the thin film transistor are stacked on the TFT substrate 21 via the insulating layer 23. The insulating layer 23 includes, for example, an insulating film between the scanning line and the semiconductor layer, an insulating film between the semiconductor layer and the signal line, and an insulating film between the signal line and the drive electrode VCOM. In the pixel substrate 2, the drive electrode VCOM, the insulating layer 23, and the pixel electrode 24 are stacked on the TFT substrate 21 in this order. For example, as a modification of the pixel substrate 2, the pixel electrode 24, the insulating layer 23, and the drive electrode VCOM may be stacked on the TFT substrate 21 in this order.

The pixel substrate 2 includes an orientation film 25 on the liquid crystal layer 6 side. Similarly, the counter substrate 3 includes an orientation film 33 on the liquid crystal layer 6 side. In the display device with a touch detection function 10 of the FFS mode, a patterned pixel electrode 24 is arranged on the drive electrode VCOM formed in the pixel substrate 2 via the insulating layer 23, and the orientation film 25 is formed to cover the pixel electrode 24. In the liquid crystal display device 20, liquid crystal elements of the liquid crystal layer 6 are held between the orientation film 25 and the orientation film 33 on the counter substrate 3 side. Two polarizing plates 26 and 35 are arranged in a crossed-nicol state. A rubbing direction of the two orientation films 25 and 33 coincides with a transmission axis of one of the two polarizing plates 26 and 35. The rubbing direction of the orientation film 25 and the orientation film 33 coincides with an arrow direction indicating the transmission axis of the polarizing plate 35 on an emitting side. The rubbing direction of the two orientation films 25 and 33 and the direction of the transmission axis of the polarizing plate 35 are set to be in substantially parallel with a direction in which the pixel electrode 24 extends in a range of specifying a direction in which a liquid crystal molecule rotates.

In the FFS mode, the liquid crystal molecule of the liquid crystal element is aligned along the rubbing direction when the electric field is not applied. In a state in which the voltage is not applied between the drive electrode VCOM and the pixel electrode 24, an axis of the liquid crystal molecule in the liquid crystal layer 6 is orthogonal to the transmission axis of the polarizing plate 26 on an incident side, and parallel with the transmission axis of the polarizing plate 35 on the emitting side. Due to this, incident light that has transmitted through the polarizing plate 26 on the incident side reaches the polarizing plate 35 on the emitting side without generating a phase difference in the liquid crystal layer 6 to be absorbed, so that black display is obtained.

On the other hand, in a state in which the voltage is applied between the drive electrode VCOM and the pixel electrode 24, in the liquid crystal layer 6, an alignment direction of the liquid crystal molecule is rotated obliquely to a direction in which the pixel electrode 24 extends due to a horizontal electric field generated between the drive electrode VCOM and the pixel electrode 24. In this case, electric field intensity in white display is optimized so that the liquid crystal molecule positioned at the center in a thickness direction of the liquid crystal layer 6 rotates about 45 degrees. Due to this, a phase difference is generated in the incident light that has transmitted through the polarizing plate 26 on the incident side while passing through the liquid crystal layer 6, and the incident light becomes linearly polarized light rotated by 90 degrees to pass through the polarizing plate 35 on the emitting side, so that white display is obtained.

The embodiment describes a case in which the liquid crystal display device 20 is a liquid crystal display panel driven in the horizontal electric field mode. However, the embodiment is not limited thereto. The liquid crystal display device 20 may be a liquid crystal display panel driven in a vertical electric field mode. The liquid crystal display panel driven in the vertical electric field mode is a liquid crystal display panel in which the liquid crystal layer is held between the pixel electrode and the common electrode (counter electrode) and the liquid crystal is driven in a direction perpendicular to a surface of the substrate. Examples of the liquid crystal display panel driven in the vertical electric field mode include a twisted nematic (TN) mode and a vertical alignment (VA) mode.

The touch detection device 30 includes the drive electrode VCOM arranged on the pixel substrate 2 and the touch detection electrode TDL arranged on the cover glass 4. The cover glass 4 is a member as a part of the surface of the display apparatus with a touch detection function 1, and includes a cover glass body 41, the touch detection electrode TDL, and an insulating layer 42. The cover glass body 41 is a transparent member arranged at an opening formed on a housing of the display apparatus with a touch detection function 1. The cover glass 4 faces the surface of the counter substrate 3 opposite to the pixel substrate 2. The touch detection electrode TDL is formed on the surface of the cover glass 4 on the counter substrate 3 side. The flexible substrate 50 electrically coupled to the touch detection electrode TDL is fixed to the cover glass 4. The insulating layer 42 is formed on surfaces of the cover glass body 41 and the touch detection electrode TDL on the counter substrate 3 side, and covers the surfaces of the cover glass body 41 and the touch detection electrode TDL.

The drive electrode VCOM is divided into a plurality of stripe electrode patterns extending in the horizontal direction of the figure. In a touch detection operation, the drive signal Vcom is sequentially supplied to each electrode pattern by the drive electrode driver 14 to perform line-sequential scanning driving in a time-division manner as described later. The touch detection electrode TDL includes a stripe electrode pattern extending in the direction intersecting the extending direction of the electrode pattern of the drive electrode VCOM. The touch detection electrode TDL is opposed to the drive electrode VCOM in a direction perpendicular to the surface of the TFT substrate 21. Each electrode pattern of the touch detection electrode TDL is coupled to the touch detection unit 15 via the flexible substrate 50. The electrode pattern in which the drive electrode VCOM intersects with the touch detection electrode TDL generates a capacitance at an intersecting portion thereof.

With this configuration, when the touch detection device 30 performs the touch detection operation, the drive electrode driver 14 serving as a drive electrode block drives the touch detection device 30 to perform line-sequential scanning in a time-division manner, and allows each detection block of the drive electrode VCOM to be sequentially selected. Touch detection for each detection block is then performed when the touch detection electrode TDL outputs the touch detection signal Vdet. That is, the drive electrode block corresponds to a drive electrode E1 in the basic principle of touch detection, the touch detection electrode TDL corresponds to a touch detection electrode E2, and the touch detection device 30 detects a touch according to the basic principle. The electrode patterns intersecting with each other in the touch detection device 30 configure an electrostatic capacitance type touch sensor in a matrix form. By scanning across the entire touch detection surface of the touch detection device 30, a position where an external proximity object is in contact with or adjacent to can be detected.

Figure 4:
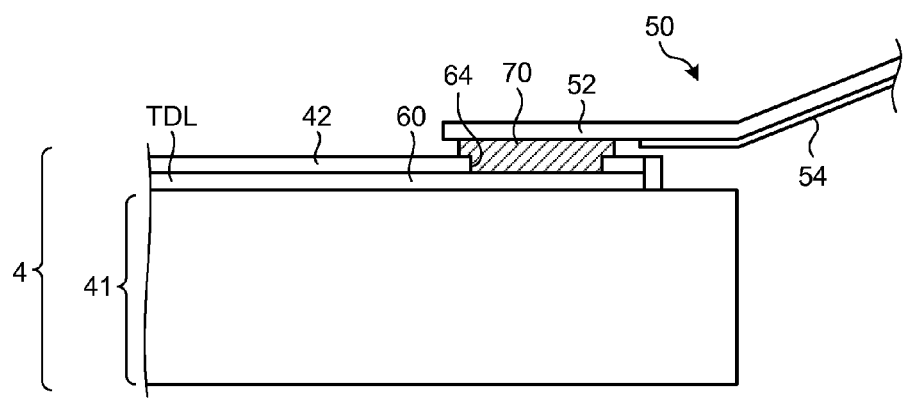
FIG. 4 is a sectional view illustrating a relation between a cover glass and a flexible substrate.
Figure 5:
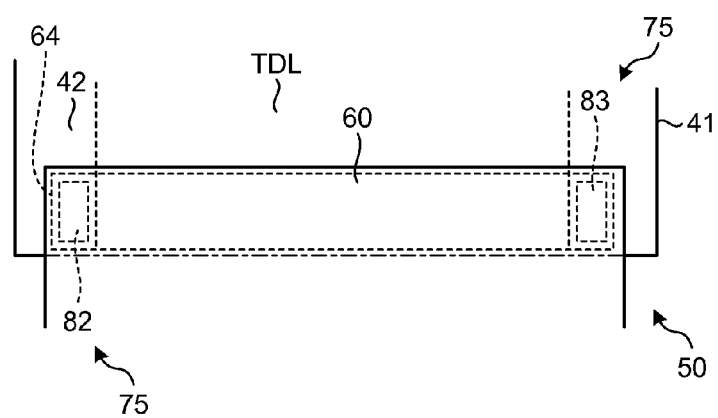
FIG. 5 is a front view illustrating a relation between the cover glass and the flexible substrate.

Next, the following describes a relation between the cover glass 4 and the flexible substrate 50 with reference to FIGS. 4 and 5. FIG. 4 is a sectional view illustrating the relation between the cover glass and the flexible substrate. FIG. 5 is a front view illustrating the relation between the cover glass and the flexible substrate.

As illustrated in FIG. 4, the cover glass 4 and the flexible substrate 50 are arranged such that an end of the flexible substrate 50 overlaps with a vicinity of an end of the cover glass 4, and are electrically coupled and physically bonded to each other via an anisotropic conductive film (ACF) 70 placed at an overlapping portion.

In the flexible substrate 50, a substrate body 52 provided with wiring and a cover layer 54 that protects the surface of the substrate body 52 provided with the wiring are stacked. The substrate body 52 is flexible, and the wiring is formed on a surface of a bendable support. The cover layer 54 is an insulating member that protects the surface of the substrate body 52 provided with the wiring. The cover layer 54 is formed on the surface of the substrate body 52 provided with the wiring, that is, the surface facing the cover glass 4. The cover layer 54 is not formed in a region overlapped with the vicinity of the end of the cover glass 4, that is, a region of the flexible substrate 50 being in contact with the anisotropic conductive film 70. Due to this, the region of the flexible substrate 50 being in contact with the anisotropic conductive film 70 is exposed, so that the substrate body 52 is brought into contact with the anisotropic conductive film 70.

As described above, in the cover glass 4, the touch detection electrode TDL and the insulating layer 42 are stacked on the surface of the cover glass body 41. As illustrated in FIG. 4, the touch detection electrode TDL is coupled to a wiring part 60 serving as a terminal at the end. The wiring part 60 is part of a path that couples the touch detection electrode TDL to the wiring of the flexible substrate 50. An opening 64 is formed in a region of the insulating film 42 provided with the wiring part 60. As illustrated in FIG. 5, the opening 64 is included in a region in which the cover glass body 41 overlaps with the flexible substrate 50. The opening 64 according to the embodiment is formed in substantially the entire region in which the cover glass body 41 overlaps with the flexible substrate 50.

The anisotropic conductive film 70 is a film in which conductive particles (such as metal particles) are distributed in thermosetting resin (an adhesive layer). The anisotropic conductive film 70 is arranged at a portion where the vicinity of the end of the cover glass 4 overlaps with the end of the flexible substrate 50. The anisotropic conductive film 70 is arranged at a position covering the opening 64 of the insulating film 42. When being crimped, the anisotropic conductive film 70 is bonded to a member being in contact therewith, and conducts the wiring with wiring of the member being in contact therewith using the conductive particles. The anisotropic conductive film 70 physically bonds the vicinity of the end of the cover glass 4 to the end of the flexible substrate 50, and conducts the wiring in the vicinity of the end of the cover glass 4 with the wiring at the end of the flexible substrate 50 facing thereto. Although the anisotropic conductive film is used in this embodiment, it is sufficient if the conductive particles are distributed in adhesive material (an adhesive agent). Alternatively, anisotropic conductive paste (APC) may be used.

In the region in which the end of the flexible substrate 50 overlaps with the vicinity of the end of the cover glass 4, formed are wiring for coupling the touch detection electrode TDL to the touch detection unit 15 and inspection patterns 75 for inspecting a coupling state between the cover glass 4 and the flexible substrate 50.

The following describes a relation between the wiring formed on the cover glass 4 and the wiring of the flexible substrate 50 in the region in which the cover glass 4 overlaps with the flexible substrate 50 with reference to FIGS. 6 to 8 in addition to FIGS. 4 to 5. FIG. 6 is a front view illustrating an example of the inspection pattern. FIG. 7 is a front view illustrating a structure of the inspection pattern on the cover glass side. FIG. 8 is a front view illustrating the structure of the inspection pattern on the flexible substrate side. FIG. 4 illustrates a state in which FIG. 3 is turned upside down.

The wiring for coupling the touch detection electrode TDL to the touch detection unit 15 includes a plurality of pieces of wiring (first wiring) 81 of the wiring part 60 and a plurality of pieces of wiring (second wiring) 92 of the flexible substrate 50 arranged to be opposed to the wiring 81. Each piece of the wiring 81 and the wiring 92 is a linear-shaped bar electrode in a region overlapped with the opening 64. The wiring 81 and the wiring 92 extend in a direction orthogonal to an end side of the cover glass 4 at which the opening 64 is provided. Each of the pieces of the wiring 81 and the wiring 92 is arranged in a direction orthogonal to the extending direction. The wiring 81 and the wiring 92 are arranged to be overlapped with each other. The wiring 92 arranged to be overlapped with the wiring 81 is conducted via the anisotropic conductive film 70.

The inspection patterns 75 include inspection electrode patterns 82 and 83 formed on the cover glass 4 and an inspection electrode pattern 90 formed on the flexible substrate 50. The inspection patterns 75 are arranged at positions with wiring (the wiring 81 and 92) for coupling the touch detection electrode TDL to the touch detection unit 15 interposed therebetween, that is, at ends in a direction orthogonal to the extending direction of the wiring 81 and 92 (the arrangement direction of the wiring 81 and 92). Specifically, the inspection electrode pattern 82 and the inspection electrode pattern 83 are arranged at positions with the wiring part 60 interposed therebetween. The inspection electrode pattern 90 is formed at a position opposed to the inspection electrode pattern 82, a position opposed to the inspection electrode pattern 83, and a position coupling these two electrode patterns to each other.

As illustrated in FIG. 7, the inspection electrode pattern 82 includes an effective electrode pattern 84 and a plurality of dummy electrodes 85. The effective electrode pattern 84 includes two terminal electrodes 120, a folded electrode 122, two terminal electrodes 124, a connection electrode 126, and a connection electrode 128. In the following description, in the region in which the cover glass 4 overlaps with the flexible substrate 50, a side to which the cover glass 4 extends (the end of the flexible substrate 50) in the extending direction of the wiring 81 and 92 is called a first end, and a side to which the flexible substrate 50 extends (the end of the cover glass 4) is called a second end.

Each of the terminal electrode 120, the folded electrode 122, and the terminal electrode 124 has a different length from each other in the extending direction of the wiring 81 and 92, and is a bar electrode extending in the extending direction of the wiring 81 and 92. The terminal electrode 120, the folded electrode 122, and the terminal electrode 124 are arranged in this order from a position farther from the wiring 81 in an arrangement direction of the wiring 81.

The terminal electrode 120 is arranged from a position of the first end of the region in which the inspection electrode pattern 82 is arranged to a position having a distance La from the first end in the extending direction of the wiring 81. The folded electrode 122 extends from the position of the first end of the region in which the inspection electrode pattern 82 is arranged to the position of the second end. The terminal electrode 124 is arranged from the position of the second end of the region in which the inspection electrode pattern 82 is arranged to a position having a distance Lb from the second end in the extending direction of the wiring 81. Accordingly, the terminal electrode 120 is distant from the terminal electrode 124 by a distance L in the extending direction of the electrode 81. The connection electrode 126 is an electrode extending in the arrangement direction of the electrode 81, and connects the first ends of the two terminal electrodes 120 to the first end of the folded electrode 122. The connection electrode 128 is an electrode extending in the arrangement direction of the electrode 81, and connects the second ends of the two terminal electrodes 124 to the second end of the folded electrode 122.

In this way, in the effective electrode pattern 84, the two terminal electrodes 120 are connected to the two terminal electrodes 124 via the folded electrode 122 and the connection electrodes 126 and 128. That is, the pieces of wiring included in a region A1 in FIG. 7 are electrically connected to each other.

The inspection electrode pattern 82 includes the four dummy electrodes 85. The two dummy electrodes 85 are arranged at a certain distance on an extension line of the extending direction of the two terminal electrodes 120. Specifically, the two dummy electrodes 85 are arranged closer to the second end as compared to the two terminal electrodes 120. The remaining two dummy electrodes 85 are arranged at a certain distance on an extension line of the extending direction of the two terminal electrodes 124. Specifically, the two dummy electrodes 85 are arranged closer to the first end as compared to the two terminal electrodes 124. The dummy electrodes 85 are arranged near the terminal electrodes 120 and 124 while being electrically isolated from the effective electrode pattern 82. The dummy electrode 85 fills a region in which the effective electrode pattern 82 is not arranged, so that the physical arrangement of the inspection electrode pattern 82 can be close to a state in which a plurality of bar electrodes having the same length are arranged in a row.

The inspection electrode pattern 83 has a symmetrical shape with respect to the inspection electrode pattern 82, and includes an effective electrode pattern 86 and a plurality of dummy electrodes 87. The effective electrode pattern 86 includes two terminal electrodes 130, a folded electrode 132, two terminal electrodes 134, a connection electrode 136, and a connection electrode 138. Each of the terminal electrode 130, the folded electrode 132, and the terminal electrode 134 has a different length from each other in the extending direction of the wiring 81 and 92, and is a bar electrode extending in the extending direction of the wiring 81 and 92. The terminal electrode 130, the folded electrode 132, and the terminal electrode 134 are arranged in this order from a position farther from the wiring 81 in the arrangement direction of the wiring 81.

The terminal electrode 130 is arranged from a position of the first end of the region in which the inspection electrode pattern 83 is arranged to a position having a distance La from the first end in the extending direction of the wiring 81. The folded electrode 132 extends from the position of the first end of the region in which the inspection electrode pattern 83 is arranged to the position of the second end. The terminal electrode 134 is arranged from the position of the second end of the region in which the inspection electrode pattern 83 is arranged to a position having a distance Lb from the second end in the extending direction of the wiring 81. Accordingly, the terminal electrode 130 is distant from the terminal electrode 134 by a distance L in the extending direction of the electrode 81. The connection electrode 136 is an electrode extending in the arrangement direction of the electrode 81, and connects the first ends of the two terminal electrodes 130 to the first end of the folded electrode 132. The connection electrode 138 is an electrode extending in the arrangement direction of the electrode 81, and connects the second ends of the two terminal electrodes 134 to the second end of the folded electrode 132.

In this way, in the effective electrode pattern 86, the two terminal electrodes 130 are connected to the two terminal electrodes 134 via the folded electrode 132 and the connection electrodes 136 and 138. That is, the pieces of wiring included in a region A2 in FIG. 7 are electrically connected to each other.

The inspection electrode pattern 83 includes the four dummy electrodes 87. The two dummy electrodes 87 are arranged at a certain distance on an extension line of the extending direction of the two terminal electrodes 130. Specifically, the two dummy electrodes 87 are arranged closer to the second end as compared to the two terminal electrodes 130. The remaining two dummy electrodes 87 are arranged at a certain distance on an extension line of the extending direction of the two terminal electrodes 134. Specifically, the two dummy electrodes 87 are arranged closer to the first end as compared to the two terminal electrodes 134. The dummy electrodes 87 are arranged near the terminal electrodes 130 and 134 while being electrically isolated from the inspection electrode pattern 83. The dummy electrode 87 fills a region in which the effective electrode pattern 86 is not arranged, so that the physical arrangement of the inspection electrode pattern 83 can be close to a state in which a plurality of bar electrodes having the same length are arranged in a row.

The inspection electrode pattern 90 is an electrode pattern formed on the flexible substrate 50, and includes a plurality of bar electrodes 93, terminals 94 and 95, and a connection electrode 98. Each of the bar electrodes 93 is a linear electrode extending from one end to the other end of the opening 84 in the extending direction of the wiring 92. The bar electrodes 93 are arranged at two positions with the wiring 92 interposed therebetween. The bar electrodes 93 include two first effective electrodes 101, a dummy electrode 102, two second effective electrodes 103, two third effective electrodes 104, a dummy electrode 105, and two fourth effective electrodes 106.

In the inspection electrode pattern 90, the two first effective electrodes 101, the dummy electrode 102, and the two second effective electrode 103 are arranged to be opposed to the bar electrodes in the inspection electrode pattern 82 (the terminal electrodes 120 and 124, the folded electrode 122, and the dummy electrodes 85). The two first effective electrodes 101, the dummy electrode 102, and the two second effective electrodes 103 are arranged in this order from a position farther from the wiring 92 in the arrangement direction of the wiring 92. The second ends of the two first effective electrodes 101 are coupled to the terminal 94. The first effective electrode 101 is arranged to be overlapped with the terminal electrode 120 and the dummy electrode 85 arranged in the extending direction of the terminal electrode 120. The dummy electrode 102 is arranged to be overlapped with the folded electrode 122. The second effective electrode 103 is arranged to be overlapped with the terminal electrode 124 and the dummy electrode 85 arranged in the extending direction of the terminal electrode 124. The second ends of the two second effective electrodes 103 are coupled to the connection electrode 98.

Next, in the inspection electrode pattern 90, the two third effective electrodes 104, the dummy electrode 105, and the two fourth effective electrodes 106 are arranged to be opposed to the bar electrodes in the inspection electrode pattern 83 (the terminal electrodes 130 and 134, the folded electrode 132, and the dummy electrodes 85). The two third effective electrodes 104, the dummy electrode 105, and the two fourth effective electrodes 106 are arranged in this order from a position farther from the wiring 92 in the arrangement direction of the wiring 92. The second ends of the two third effective electrodes 104 are coupled to the terminal 95. The third effective electrode 104 is arranged to be overlapped with the terminal electrode 134 and the dummy electrode 105 arranged in the extending direction of the terminal electrode 134. The dummy electrode 105 is arranged to be overlapped with the folded electrode 132. The fourth effective electrode 106 is arranged to be overlapped with the terminal electrode 134 and the dummy electrode 105 arranged in the extending direction of the terminal electrode 134. The second ends of the two fourth effective electrodes 106 are coupled to the connection electrode 98.

The connection electrode 98 electrically couples the two second effective electrodes 103 to the two fourth effective electrodes 106. The inspection electrode pattern 90 has the configuration as described above in which the terminal 94 and the two first effective electrodes 101 included in a region A3 are electrically coupled to each other, the second effective electrodes 103, the fourth effective electrodes 106, and the connection electrode 98 included in a region A4 are electrically coupled to each other, and the terminal 95 and the third effective electrodes 104 included in a region A5 are electrically coupled to each other.

The inspection pattern 75 has the structure as described above, and can detect a coupling state between the cover glass 4 and the flexible substrate 50 by causing a terminal of an inspecting device to be in contact with the terminal 94 and the terminal 95 to detect whether electric current flows. Specifically, as illustrated in FIG. 6, when the inspection electrode patterns 82 and 83 and the inspection electrode pattern 90 are appropriately bonded to each other and the terminal of the inspecting device is caused to be in contact with the terminal 94 and the terminal 95 to perform inspection, as illustrated as an energizing path 110, the electric current flows through the terminal 94, the first effective electrode 101, the effective electrode pattern 84, the second effective electrode 103, the connection electrode 98, the fourth effective electrode 106, the effective electrode pattern 86, the third effective electrode 104, and the terminal 95 in this order. That is, the electric current flows through the region A3, the region A1, the region A4, the region A2, and the region A5 in this order.

Figure 9A:
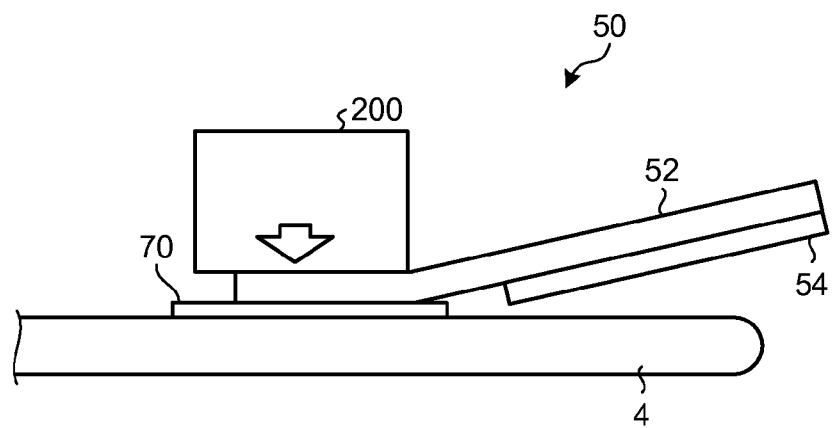
FIG. 9A is a side view illustrating an example of an operation in crimping the cover glass onto the flexible substrate.
Figure 9B:
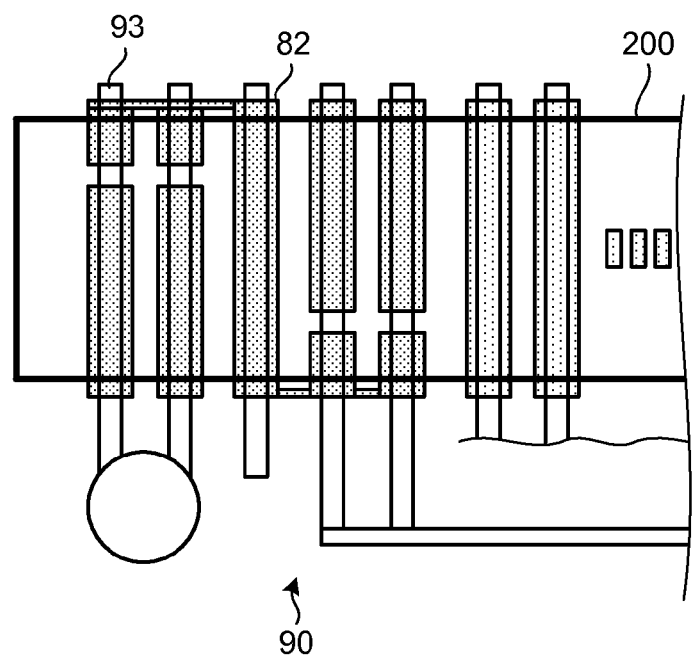
FIG. 9B is a top view illustrating an example of the operation in crimping the cover glass onto the flexible substrate.
Figure 10A:
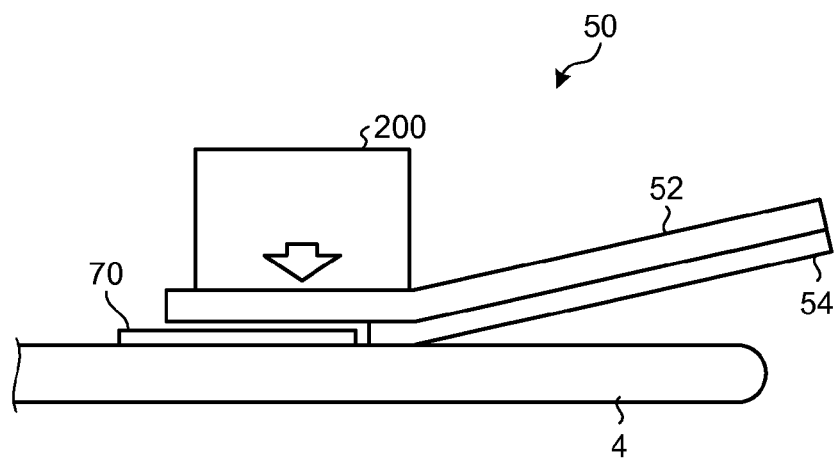
FIG. 10A is a side view illustrating an example of the operation in crimping the cover glass onto the flexible substrate.
Figure 10B:
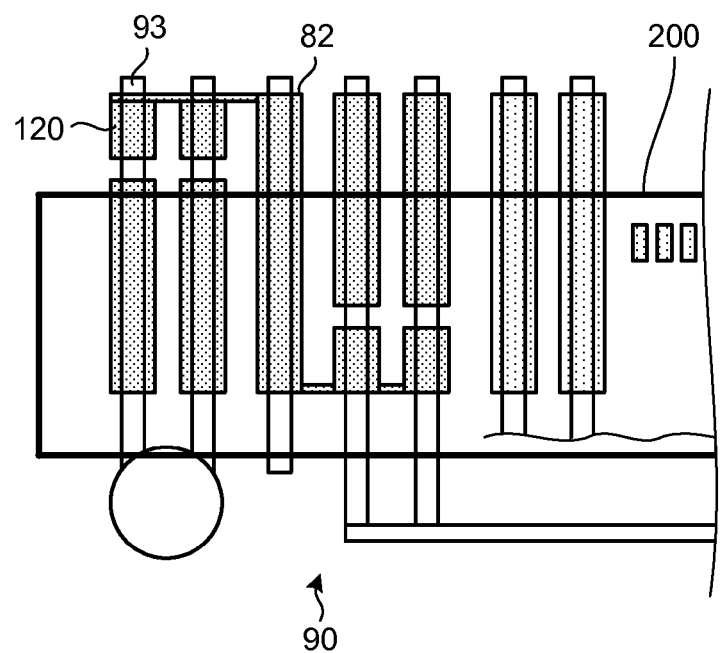
FIG. 10B is a top view illustrating an example of the operation in crimping the cover glass onto the flexible substrate.
Figure 11A:
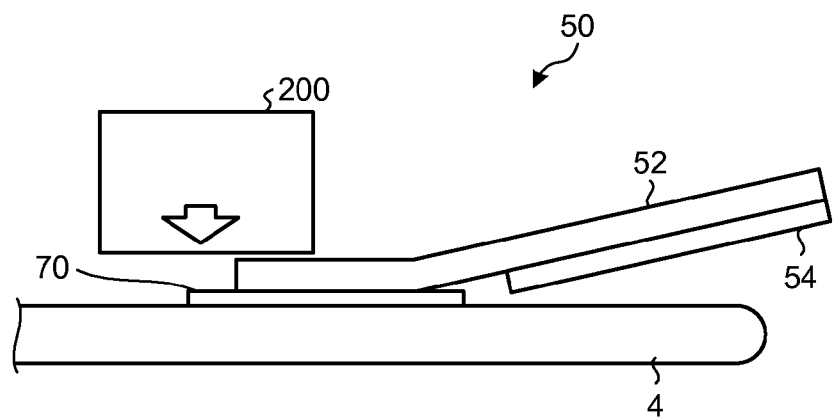
FIG. 11A is a side view illustrating an example of the operation in crimping the cover glass onto the flexible substrate.
Figure 11B:
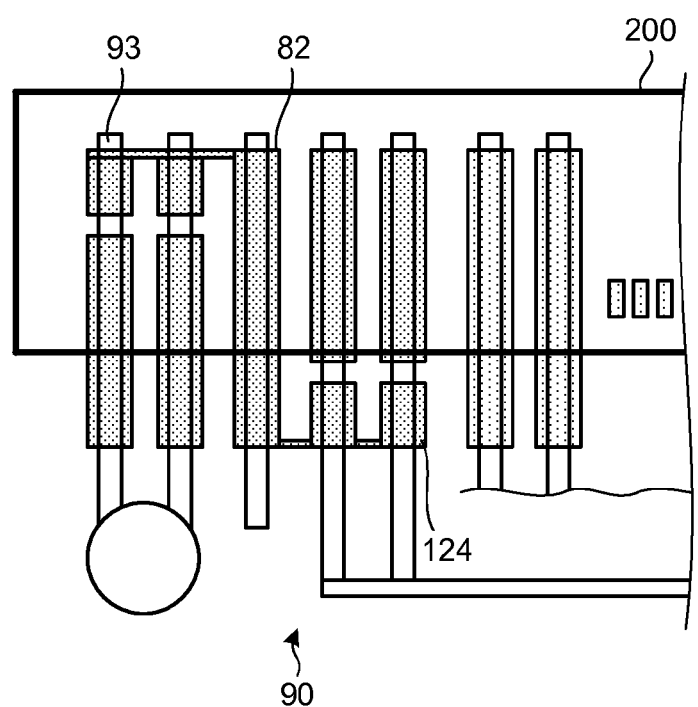
FIG. 11B is a top view illustrating an example of the operation in crimping the cover glass onto the flexible substrate.

FIG. 9A is a side view illustrating an example of an operation in crimping the cover glass onto the flexible substrate. FIG. 9B is a top view illustrating an example of the operation in crimping the cover glass onto the flexible substrate. FIG. 10A is a side view illustrating an example of the operation in crimping the cover glass onto the flexible substrate. FIG. 10B is a top view illustrating an example of the operation in crimping the cover glass onto the flexible substrate. FIG. 11A is a side view illustrating an example of the operation in crimping the cover glass onto the flexible substrate. FIG. 11B is a top view illustrating an example of the operation in crimping the cover glass onto the flexible substrate.

The following describes the inspection pattern in more detail with reference to FIGS. 9A to 11B. In the display device with a touch detection function 10, a portion where the anisotropic conductive film 70 is arranged is pressurized with a crimping head in a state in which the cover glass 4, the anisotropic conductive film 70, and the flexible substrate 50 are stacked in this order to conduct the overlapping pieces of wiring and the electrodes with each other via the anisotropic conductive film 70.

In this case, as illustrated in FIGS. 9A and 9B, when an appropriate position of the region in which the cover glass 4, the anisotropic conductive film 70, and the flexible substrate 50 are overlapped with each other is crimped with a crimping head 200 in the extending direction of the wiring 81 and 92, the pressure from the crimping head 200 is applied to both of the terminal electrode 120 and the terminal electrode 124 of the effective electrode pattern 84, the terminal electrode 120 is crimped onto the first effective electrode 101, and the terminal electrode 124 is crimped onto the second effective electrode 103. When the inspection electrode pattern 83 is similarly crimped at an appropriate position, the terminal electrode 130 is crimped onto the third effective electrode 104, and the terminal electrode 134 is crimped onto the fourth effective electrode 106. Accordingly, the electric current is caused to flow through the energizing path 110 described above.

On the other hand, as illustrated in FIGS. 10A and 10B, when a position shifted from the appropriate position of the region in which the cover glass 4, the anisotropic conductive film 70, and the flexible substrate 50 are overlapped with each other toward the second end, that is, the side toward which the flexible substrate 50 extends is crimped with the crimping head 200 in the extending direction of the wiring 81 and 92, part of the crimping head 200 undesirably presses the region in which the cover layer 54 is arranged. Accordingly, crimping may be insufficient in some cases for applying appropriate pressure to the region in which the cover glass 4, the anisotropic conductive film 70, and the flexible substrate 50 are overlapped with each other, so that products that can easily break down or defective products may be produced with high possibility. In this case, as illustrated in FIG. 10B, the pressure from the crimping head 200 is not sufficiently applied to a portion where the terminal electrode 120 of the effective electrode pattern 84 is formed. Accordingly, the terminal electrode 120 is not crimped onto the first effective electrode 101 and they are not conducted with each other. As a result, part of the energizing path 110 described above is not conducted, so that the electric current does not flow.

Next, as illustrated in FIGS. 11A and 11B, when a position shifted from the appropriate position of the region in which the cover glass 4, the anisotropic conductive film 70, and the flexible substrate 50 are overlapped with each other toward the first end, that is, the side toward which the cover glass 4 extends is crimped with the crimping head 200 in the extending direction of the wiring 81 and 92, an area of the flexible substrate 50 being in contact with the crimping head 200 decreases. An excessive pressure is partly applied, so that a bonding component of the anisotropic conductive film 70 may move and bonding strength of the crimped portion may be insufficient in some cases. In addition, the bonding area may be insufficient. Accordingly, products that can easily break down or defective products may be produced with high possibility. In this case, as illustrated in FIG. 11B, the pressure from the crimping head 200 is not sufficiently applied to the portion where the terminal electrode 124 of the effective electrode pattern 84 is formed. Accordingly, the terminal electrode 124 is not crimped onto the second effective electrode 103 and they are not conducted with each other. As a result, part of the energizing path 110 described above is not conducted, so that the electric current does not flow.

In this way, in the inspection pattern 75 according to the embodiment, when the position of the crimping head in crimping is shifted from the appropriate position of the region in which the cover glass 4, the anisotropic conductive film 70, and the flexible substrate 50 are overlapped with each other in the extending direction of the wiring 81 and 92, the electric current does not flow through the energizing path 110 as illustrated in FIGS. 11A, 11B, 12A, and 12B. When the crimping head in crimping is at the appropriate position, the electric current flows through the energizing path 110 as illustrated in FIGS. 9A and 9B.

As described above, by providing the inspection pattern 75, the display apparatus with a touch detection function 1 can easily inspect whether the cover glass 4, the anisotropic conductive film 70, and the flexible substrate 50 are appropriately coupled to each other in manufacturing. Specifically, inspecting the conduction of the inspection pattern 75 can inspect whether the crimping position in the extending direction of the wiring 81 and 92 is appropriate, and whether the wiring 81 is conducted with the wiring 92.

As it can be determined whether the position of the crimping head in crimping is appropriate as in this embodiment, the coupling state can be appropriately detected even if a positional relation is such that the position of the cover glass to which the flexible substrate is fixed is closer to the center than the end of the cover glass and the cover layer of the flexible substrate is arranged at the position facing the cover glass as in this embodiment. Accordingly, even when a substrate unit has a positional relation in which the cover layer of the flexible substrate is arranged on the position facing the cover glass, the substrate unit can be determined to be appropriately coupled.

Because the coupling state can be determined by detecting energization, the coupling state can be determined without observing a state of the conductive particles in the anisotropic conductive film. Due to this, the coupling state can be determined even with a structure in which the state of the anisotropic conductive film cannot be observed from both sides of the cover glass and the flexible substrate, and the substrate unit can be determined to be appropriately coupled. Accordingly, for example, even when blindfold coating is applied or a film is laminated on the periphery of the surface of the cover glass 4, the substrate unit can be determined to be appropriately coupled.

When it can be determined whether the position of the crimping head in crimping is appropriate as in this embodiment, the size of the crimping head can be caused to be substantially the same as or slightly larger than the region to be crimped, so that the size of the crimping head can be reduced.

As in this embodiment, by providing the inspection patterns at the positions with the wiring 81 and 92 interposed therebetween, that is, both ends of the region in which the cover glass and the flexible substrate are overlapped with each other, it can be determined whether the crimping on the entire region in which the cover glass and the flexible substrate are overlapped with each other is appropriate. If the crimping head is inclined with respect to the region in which the cover glass and the flexible substrate are overlapped with each other, part of one of the effective electrodes is not conducted. This structure makes it possible to appropriately detect a case in which the crimping head is inclined and bonded to the region in which the cover glass and the flexible substrate are overlapped with each other and the crimping is insufficient.

Figure 12:
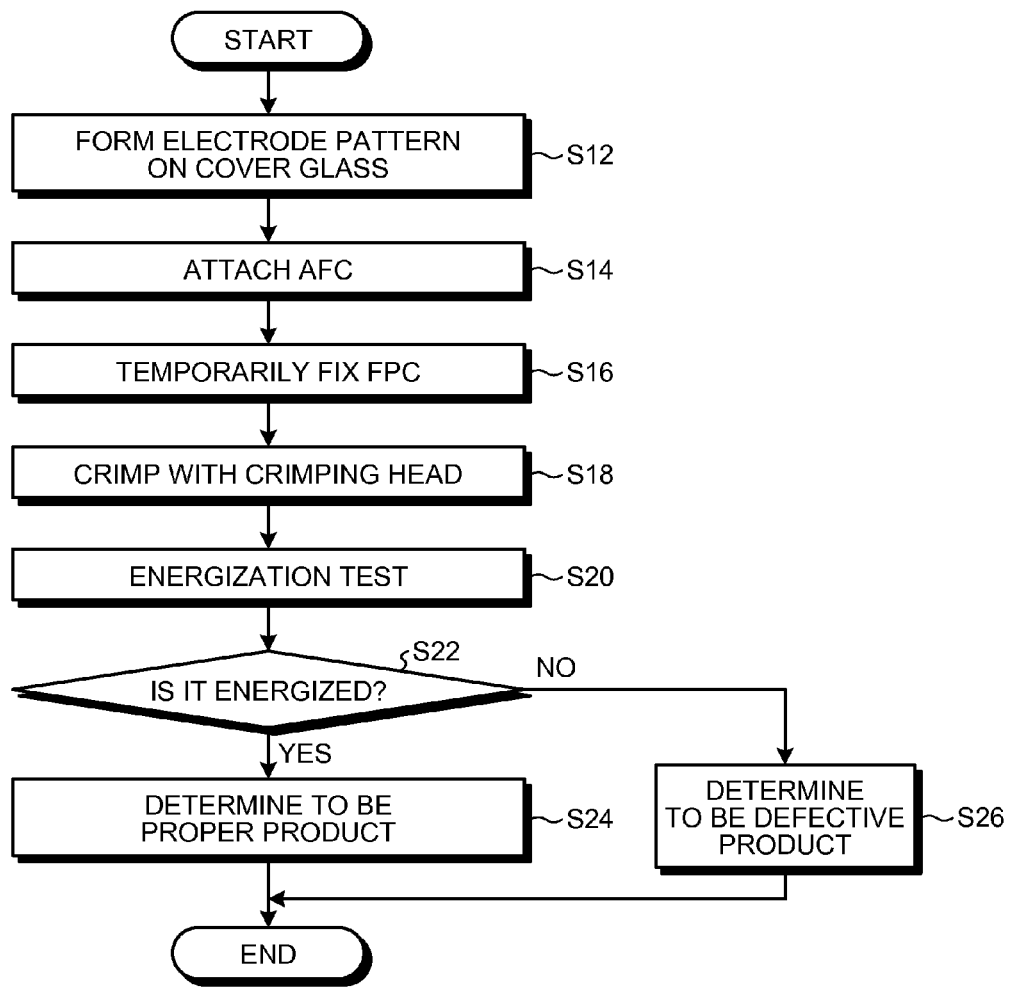
FIG. 12 is a flowchart for explaining an example of the operation in crimping the cover glass onto the flexible substrate.

Next, the following describes an example of a method of manufacturing the substrate unit in which the cover glass is coupled to the flexible substrate with reference to FIG. 12. FIG. 12 is a flowchart for explaining an example of the operation in crimping the cover glass onto the flexible substrate. The electrode pattern is formed on the cover glass 4 (Step S12). Specifically, formed are the touch detection electrode TDL, the wiring part 60, and the inspection electrode patterns 82 and 83. The electrode pattern may be formed as a monolayer or a laminated structure. The insulating layer having the opening 64 is formed on the surface of the cover glass. After forming the electrode pattern on the cover glass 4, the anisotropic conductive film (ACF) is attached to the region including the opening 64 (Step S14), and the flexible substrate (FPC) is temporarily fixed to the position overlapped with the ACF (Step S16). A method of temporary fixing is such that, although not specifically limited thereto, alignment is performed to determine a position where the wiring of the cover glass 4 overlaps with the wiring of the flexible substrate 50. The wiring 92 and the inspection electrode pattern 90 are formed on the flexible substrate. After the flexible substrate is temporarily fixed to the cover glass and is crimped with the crimping head, the cover glass is coupled to the flexible substrate using the anisotropic conductive film (Step S18).

After the cover glass is coupled to the flexible substrate using the anisotropic conductive film, an energization test is performed (Step S20) to determine whether they are energized (Step S22). If it is determined that they are energized (Yes at Step S22), they are determined to be a proper product (Step S24). If it is determined that they are not energized (No at Step S22), they are determined to be a defective product (Step S26).

In this way, forming a inspection pattern and determining the coupling state with the inspection result using the inspection pattern allows the energization state to be changed depending on whether the position of the crimping head in crimping is appropriate, and whether the substrate unit is appropriate can be preferably determined.

The distance L between the terminal electrodes in the extending direction of the wiring 81 and 92 is preferably 60% or more of the length of the region in which the inspection pattern 75 is arranged in the region in which the cover glass 4, the anisotropic conductive film 70, and the flexible substrate 50 are overlapped with each other. A total value of the distances La and Lb of the terminal electrodes in the extending direction of the wiring 81 and 92, that is, La+Lb, is preferably 40% or less of the length of the region in which the inspection pattern 75 is arranged in the region in which the cover glass 4, the anisotropic conductive film 70, and the flexible substrate 50 are overlapped with each other. This structure makes it possible to detect misalignment of the crimping head with high accuracy, so that possibility of shipping products that easily break down or defective products can be reduced with higher probability.

The structure of the inspection pattern is not limited to the above embodiment. For example, although two terminal electrodes are used in the embodiment, the number of the terminal electrodes may be one, or three or more.

According to the embodiment, providing the dummy electrode can reduce change in the arrangement of the electrodes in the region crimped with the crimping head. Accordingly, distribution of the pressure from the crimping head can be uniformized. Thus the dummy electrode is preferably but not necessarily provided.

According to the embodiment, the two terminal electrodes at different positions along the extending direction of the wiring 81 and 92 are electrically coupled to each other with the folded electrode formed at a fixed interval similarly to the terminal electrodes. Alternatively, the terminal electrodes may be coupled to each other with another electrode. For example, the terminal electrodes may be coupled to each other with an electrode that is not arranged in parallel with the terminal electrodes.

In the inspection pattern according to the embodiment, the terminal is arranged on the flexible substrate and the effective electrode having the electrode at a distance in the extending direction of the wiring 81 and 92 is arranged on the cover glass. Alternatively, the substrates may be reversed on which the terminal and the effective electrode are arranged respectively.

Figure 13:
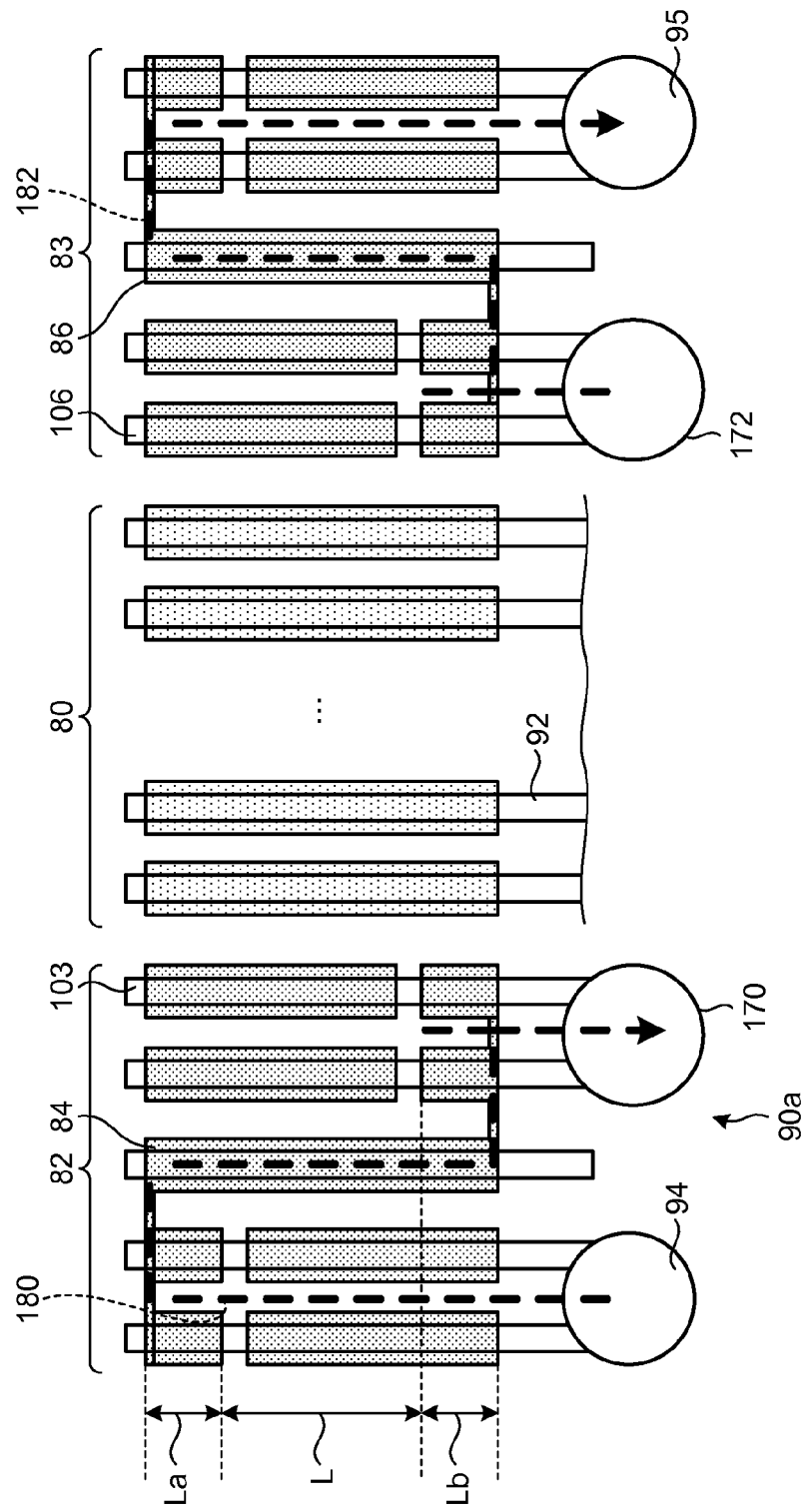
FIG. 13 is a front view illustrating another example of the inspection pattern.

FIG. 13 is a front view illustrating another example of the inspection pattern. The inspection pattern of FIG. 13 is obtained by partly changing the inspection pattern of FIG. 6, and has the same basic structure. The following describes points unique to the inspection pattern of FIG. 13.

The inspection pattern illustrated in FIG. 13 includes a terminal 170 and a terminal 172 instead of the connection electrode 98. The second ends of the second effective electrodes 103 are coupled to the terminal 170. The second ends of the fourth effective electrodes 106 are coupled to the terminal 172. In the inspection pattern, an energizing path 180 is formed with the terminal 94, the first effective electrode 101, the effective electrode pattern 84, the second effective electrode 103, and the terminal 170. An energizing path 182 is formed with the terminal 95, the third effective electrode 104, the effective electrode pattern 86, the fourth effective electrode 106, and the terminal 172.

As illustrated in FIG. 13, the same effect as that described above can be obtained even when the inspection patterns arranged at positions with the wiring 81 and 92 interposed therebetween, that is, at both ends of the region in which the cover glass and the flexible substrate are overlapped with each other are not conducted with each other to be separate circuits. When the circuits are separated, although the number of times of continuity test increases, the wiring for coupling the inspection patterns to each other arranged on both ends of the region in which the cover glass and the flexible substrate are overlapped with each other can be omitted.

Figure 14:
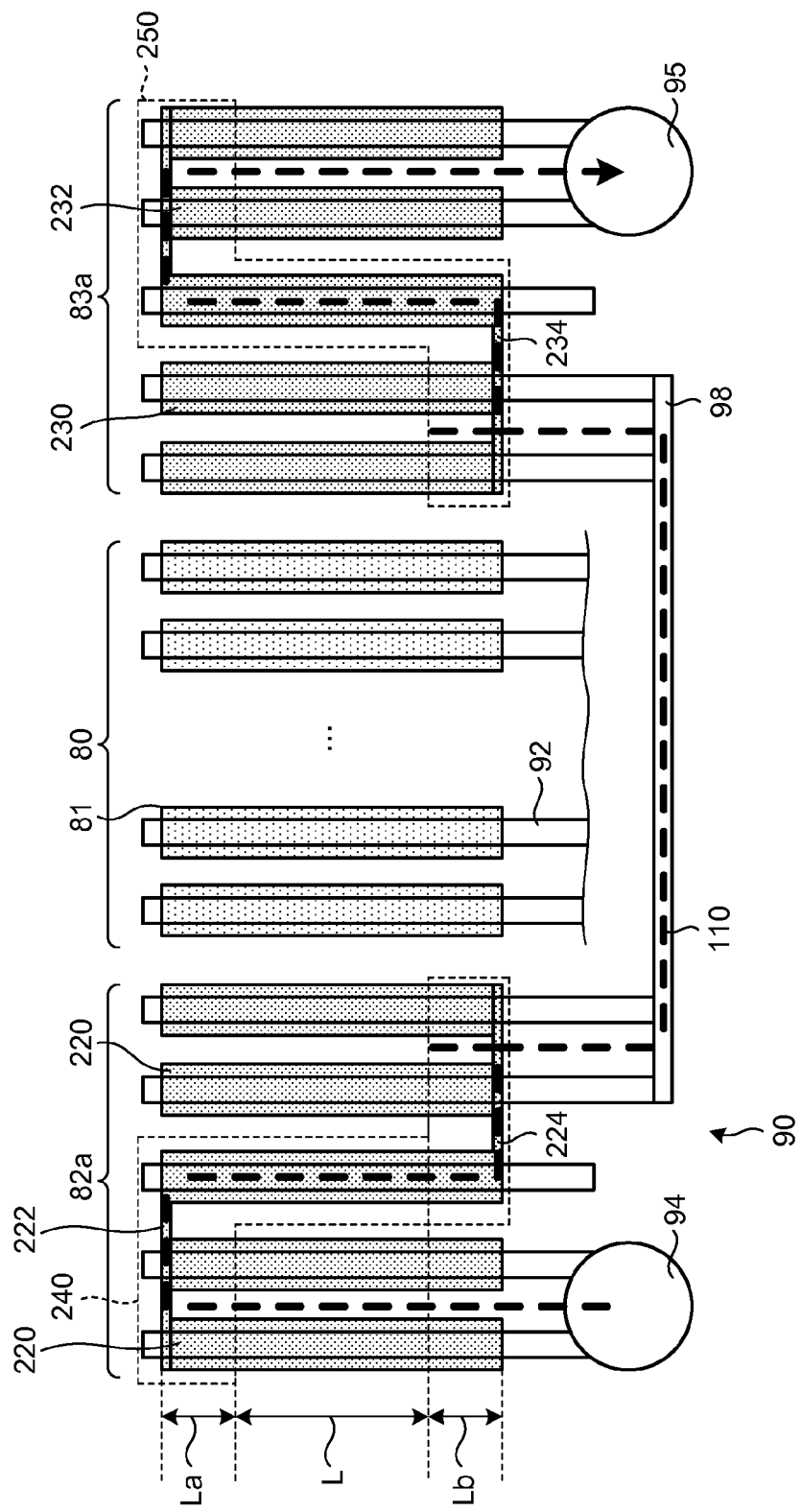
FIG. 14 is a front view illustrating another example of the inspection pattern.

FIG. 14 is a front view illustrating another example of the inspection pattern. The inspection pattern of FIG. 14 is obtained by partly changing the inspection pattern of FIG. 6, and has the same basic structure. The following describes points unique to the inspection pattern of FIG. 14.

An inspection electrode pattern 82a includes a plurality of bar electrodes 220 and connection electrodes 222 and 224. The bar electrodes 220 extend from the first end to the second end, and arranged in parallel with each other. The connection electrode 222 couples the first end of the bar electrode 220 away from the wiring 81 to the first end of the bar electrode 220 at the center. The connection electrode 224 couples the second end of the bar electrode 220 close to the wiring 81 to the second end of the bar electrode 220 at the center.

An inspection electrode pattern 83a includes a plurality of bar electrodes 230 and connection electrodes 232 and 234. The bar electrodes 230 extend from the first end to the second end, and arranged in parallel with each other. The connection electrode 232 couples the first end of the bar electrode 230 away from the wiring 81 to the first end of the bar electrode 230 at the center. The connection electrode 234 couples the second end of the bar electrode 230 close to the wiring 81 to the second end of the bar electrode 230 at the center.

In the inspection pattern illustrated in FIG. 14, the opening 240 formed on the insulating layer has the same shape as the effective electrode pattern 84 in FIG. 6, and the opening 250 has the same shape as the effective electrode pattern 84 in FIG. 6.

As described above, instead of the shape of the inspection electrode pattern, the shape of the openings 240 and 250 arranged between the wiring on the flexible substrate 50 side and the wiring on the cover glass 4 side are utilized. Accordingly, at a first portion that includes at least one of the bar electrodes, an electrode on the cover glass side (first inspection electrode), a pattern electrode, and an inspection electrode of the inspection electrode pattern on the flexible substrate 50 side (second inspection electrode) may be conducted with each other. At a second portion that is different from the first portion and includes at least one of the bar electrodes, an electrode on the cover glass side (first inspection electrode), the pattern electrode, and the inspection electrode of the inspection electrode pattern on the flexible substrate 50 side (second inspection electrode) may be conducted with each other. Additionally, the first portion and the second portion may be arranged at positions not overlapped with each other along the extending direction (first direction) of the wiring 81 and 82. Accordingly, as described above, it can be determined whether the position to which the crimping head applies the pressure is appropriate in the extending direction of the wiring 81 and 82.

In the embodiment, the flexible substrate is coupled to the cover glass. However, the embodiment is not limited thereto. Various substrates may be used as a substrate to which the flexible substrate is coupled. For example, in a case of the display device with a touch detection function 10, the same inspection pattern may be provided in coupling the flexible substrate to the TFT substrate.

The display apparatus with a touch detection function 1 according to the embodiment can be applied to electronic apparatuses in various fields such as television apparatuses, digital cameras, notebook-type personal computers, portable electronic apparatuses such as cellular telephones, or video cameras. In other words, the display apparatus with a touch detection function 1 can be applied to electronic apparatuses in various fields that display a video signal input from the outside or a video signal generated inside as an image or video.

Figure 15:
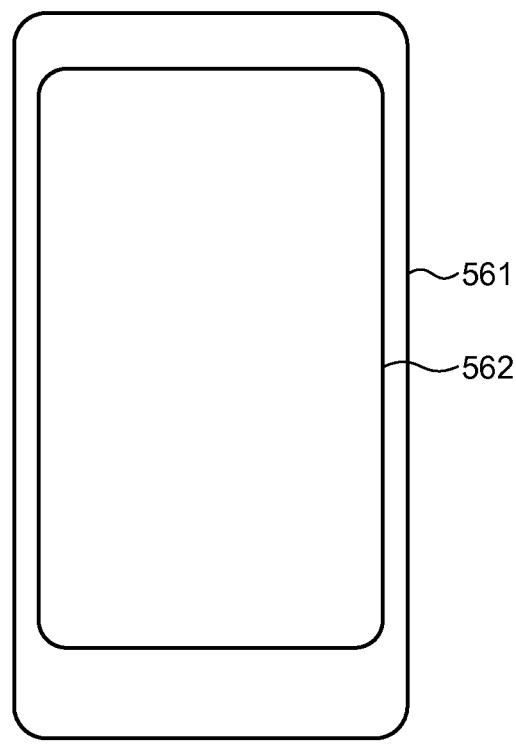
FIG. 15 is a diagram illustrating an example of an electronic apparatus including the display apparatus with a touch detection function according to an embodiment.

FIG. 15 is a diagram illustrating an example of an electronic apparatus including the display apparatus with a touch detection function according to the embodiment. The electronic apparatus illustrated in FIG. 15 is a mobile phone, what is called a smartphone, to which the display apparatus with a touch detection function 1 is applied. The mobile phone includes, for example, a touch panel 562 on the surface of a housing 561 having a substantially rectangular thin plate shape. The touch panel 562 includes the display apparatus with a touch detection function 1.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A substrate unit comprising:
a first substrate provided with first wiring;
a second substrate provided with second wiring on a flexible substrate body;
an adhesive layer in which conductive particles and an adhesive agent are mixed to conduct the first wiring of the first substrate with the second wiring of the second substrate; and
an inspection pattern including a first inspection electrode formed in a region of the first substrate in which the adhesive layer is arranged and a second inspection electrode formed in a region of the second substrate facing the first inspection electrode and conducted with the first inspection electrode via the adhesive layer, wherein
in the inspection pattern, one of the first inspection electrode and the second inspection electrode includes a connection electrode that connects a plurality of adjacent bar electrodes arranged to extend in a first direction to each other,
the first inspection electrode is conducted with the second inspection electrode at a first portion that includes at least one of the bar electrodes, the first inspection electrode is conducted with the second inspection electrode at a second portion that is different from the first portion and includes at least one of the bar electrodes, and the first portion and the second portion are arranged at positions not overlapped with each other along the first direction, and
electric current does not flow when one of the first portion and the second portion is not conducted.

2. The substrate unit according to claim 1, wherein
the first portion comprises the bar electrodes, and
the second portion comprises the bar electrodes.

3. The substrate unit according to claim 1, wherein
in the inspection pattern, another bar electrode is arranged between the first portion and the second portion, and
a first end of the other bar electrode is connected to the first portion via the connection electrode, and a second end thereof is connected to the second portion via the connection electrode.

4. The substrate unit according to claim 1, wherein in the inspection pattern, the other one of the first inspection electrode and the second inspection electrode includes an electrode arranged in a region overlapped with the bar electrode.

5. The substrate unit according to claim 1, wherein in the inspection pattern, one of the first inspection electrode and the second inspection electrode includes dummy electrodes arranged at a portion on an extension line of the bar electrode in the first portion and on the second portion side in the first direction, and at a portion on the extension line of the bar electrode in the second portion and on the first portion side in the first direction.

6. The substrate unit according to claim 1, wherein in the inspection pattern, the first inspection electrodes are formed with the first wiring interposed therebetween, and the second inspection electrodes are formed with the second wiring interposed therebetween.

7. The substrate unit according to claim 6, wherein in the inspection pattern, the first inspection electrodes at two positions formed with the first wiring interposed therebetween are conducted and the second inspection electrodes at two positions formed with the second wiring interposed therebetween are conducted to configure one circuit.

8. The substrate unit according to claim 1, wherein the adhesive layer is an anisotropic conductive film.

9. A liquid crystal display apparatus comprising:
a substrate unit comprising:
   a first substrate provided with first wiring;
   a second substrate provided with second wiring on a flexible substrate body;
   an adhesive layer in which conductive particles and an adhesive agent are mixed to conduct the first wiring of the first substrate with the second wiring of the second substrate; and
   an inspection pattern including a first inspection electrode formed in a region of the first substrate in which the adhesive layer is arranged and a second inspection electrode formed in a region of the second substrate facing the first inspection electrode and conducted with the first inspection electrode via the adhesive layer,
   in the inspection pattern, one of the first inspection electrode and the second inspection electrode including a connection electrode that connects a plurality of adjacent bar electrodes arranged to extend in a first direction to each other,
   the first inspection electrode being conducted with the second inspection electrode at a first portion that includes at least one of the bar electrodes, the first inspection electrode being conducted with the second inspection electrode at a second portion that is different from the first portion and includes at least one of the bar electrodes, and the first portion and the second portion being arranged at positions not overlapped with each other along the first direction,
   electric current not flowing when one of the first portion and the second portion is not conducted; and
a liquid crystal display unit stacked on the substrate unit.

10. An electronic apparatus comprising:
a substrate unit comprising:
   a first substrate provided with first wiring;
   a second substrate provided with second wiring on a flexible substrate body;
   an adhesive layer in which conductive particles and an adhesive agent are mixed to conduct the first wiring of the first substrate with the second wiring of the second substrate; and
   an inspection pattern including a first inspection electrode formed in a region of the first substrate in which the adhesive layer is arranged and a second inspection electrode formed in a region of the second substrate facing the first inspection electrode and conducted with the first inspection electrode via the adhesive layer,
   in the inspection pattern, one of the first inspection electrode and the second inspection electrode including a connection electrode that connects a plurality of adjacent bar electrodes arranged to extend in a first direction to each other,
   the first inspection electrode being conducted with the second inspection electrode at a first portion that includes at least one of the bar electrodes, the first inspection electrode being conducted with the second inspection electrode at a second portion that is different from the first portion and includes at least one of the bar electrodes, and the first portion and the second portion being arranged at positions not overlapped with each other along the first direction,
   electric current not flowing when one of the first portion and the second portion is not conducted; and
a control device coupled to the second substrate of the substrate unit.

* * * * *